(12) United States Patent
Xu

(10) Patent No.: US 12,218,125 B2
(45) Date of Patent: Feb. 4, 2025

(54) ELECTRO-STATIC DISCHARGE PROTECTION STRUCTURE AND CHIP

(71) Applicant: CHANGXIN MEMORY TECHNOLOGIES, INC., Hefei (CN)

(72) Inventor: Qian Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 496 days.

(21) Appl. No.: 17/658,293

(22) Filed: Apr. 7, 2022

(65) Prior Publication Data
US 2023/0012968 A1    Jan. 19, 2023

(30) Foreign Application Priority Data
Jul. 14, 2021    (CN) .......................... 202110793560.7

(51) Int. Cl.
*H01L 27/02*    (2006.01)
*H02H 9/04*    (2006.01)

(52) U.S. Cl.
CPC ...... *H01L 27/0259* (2013.01); *H01L 27/0255* (2013.01); *H02H 9/046* (2013.01); *H01L 27/0288* (2013.01)

(58) Field of Classification Search
CPC .................................................... H01L 27/259
USPC .......................................................... 257/25
See application file for complete search history.

(56) References Cited

U.S. PATENT DOCUMENTS

| | | | |
|---|---|---|---|
| 9,437,591 B1* | 9/2016 | Nidhi | H01L 27/0262 |
| 9,705,318 B2 | 7/2017 | Chaine et al. | |
| 10,141,300 B1* | 11/2018 | Mallikarjunaswamy | H01L 29/0649 |
| 2013/0114173 A1* | 5/2013 | Chen | H01L 27/0255 361/56 |
| 2013/0134479 A1* | 5/2013 | Xu | H01L 27/0262 257/173 |
| 2016/0300830 A1* | 10/2016 | Salcedo | H01L 27/0262 |
| 2021/0098445 A1* | 4/2021 | Lin | H01L 27/0285 |
| 2023/0040542 A1* | 2/2023 | Xu | H01L 27/02 |
| 2023/0420444 A1* | 12/2023 | Song | H02H 9/046 |

FOREIGN PATENT DOCUMENTS

CN    106158942 B    7/2019

* cited by examiner

*Primary Examiner* — Jami Valentine Miller
(74) *Attorney, Agent, or Firm* — Syncoda LLC; Feng Ma

(57) ABSTRACT

The present disclosure relates to the technical field of semiconductors, and provides an electro-static discharge (ESD) protection structure and a chip. The ESD protection structure includes: a semiconductor substrate, a first P-type well, a first N-type well, a first N-type doped portion, a first P-type doped portion, a second N-type doped portion, a second P-type doped portion, a third doped well, a third P-type doped portion and a third N-type doped portion, wherein the first P-type well, the first N-type well and the third doped well are located in the semiconductor substrate; the first N-type doped portion and the first P-type doped portion are located in the first N-type well and spaced apart; the second N-type doped portion and the second P-type doped portion are located in the first P-type well and spaced apart.

15 Claims, 7 Drawing Sheets

ELECTRO-STATIC DISCHARGE PROTECTION STRUCTURE AND CHIP

CROSS-REFERENCE TO RELATED APPLICATIONS

This application claims the priority of Chinese Patent Application No. 202110793560.7, submitted to the Chinese Intellectual Property Office on Jul. 14, 2021, the disclosure of which is incorporated herein in its entirety by reference.

TECHNICAL FIELD

The present disclosure relates to the technical field of semiconductors, and in particular, to an electro-static discharge (ESD) protection structure and a chip.

BACKGROUND

An ESD protection circuit is generally required in a chip. The ESD protection circuit is used to discharge static electricity in the chip, to avoid damage to a core circuit in the chip under action of the static electricity.

In the related art, commonly used ESD protection structures include metal oxide semiconductor (MOS) transistors, diodes, thyristors, and other components. However, the ESD protection structure in the related art has a high trigger voltage, that is, the ESD protection structure in the related art cannot be triggered in a timely manner at a low electro-static voltage to discharge the static electricity.

It should be noted that the information disclosed above is merely intended to facilitate a better understanding of the background of the present disclosure, and therefore may include information that does not constitute the prior art known to those of ordinary skill in the art.

SUMMARY

According to one aspect of the present disclosure, an ESD protection structure is provided, wherein the ESD protection structure includes: a semiconductor substrate, a first P-type well, a first N-type well, a first N-type doped portion, a first P-type doped portion, a second N-type doped portion, a second P-type doped portion, a third doped well, a third P-type doped portion and a third N-type doped portion; the first P-type well is located in the semiconductor substrate; the first N-type well is located in the semiconductor substrate; the first N-type doped portion is located in the first N-type well; the first P-type doped portion is located in the first N-type well, and spaced apart from the first N-type doped portion; the second N-type doped portion is located in the first P-type well; the second P-type doped portion is located in the first P-type well, and spaced apart from the second N-type doped portion; the third doped well is located in the semiconductor substrate; the third P-type doped portion is located in the third doped well; the third N-type doped portion is located in the third doped well, and spaced apart from the third P-type doped portion; the second N-type doped portion, the second P-type doped portion and the third N-type doped portion are electrically connected; and the first N-type doped portion is electrically connected to the third P-type doped portion.

It should be understood that the above general description and the following detailed description are only exemplary and explanatory, and should not be construed as a limitation to the present disclosure.

BRIEF DESCRIPTION OF THE DRAWINGS

The drawings incorporated into the specification and constituting part of the specification illustrate the embodiments of the present disclosure, and serve, together with the specification, to explain the principles of the present disclosure. Apparently, the drawings in the following description show merely some embodiments of the present disclosure, and those of ordinary skill in the art may still derive other drawings from these drawings without creative efforts.

DETAILED DESCRIPTION

Figure 1:
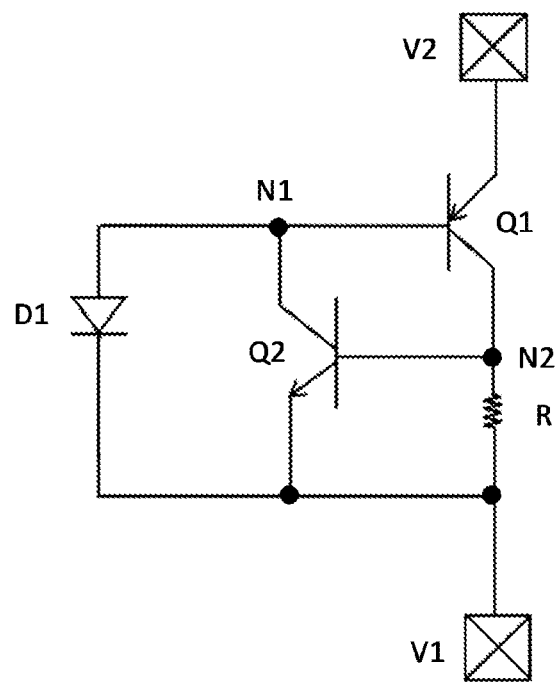
FIG. 1 is a schematic structural diagram of an exemplary embodiment of an ESD protection circuit according to the present disclosure.

Exemplary embodiments will be described below comprehensively with reference to the accompanying drawings. However, the exemplary embodiments can be implemented in a plurality of forms and should not be construed as being limited to examples described herein. On the contrary, these embodiments are provided such that the present disclosure is more comprehensive and complete, and fully conveys the concept of the exemplary embodiments to persons skilled in the art. The same reference numerals in the figures indicate the same or similar structures, and thus their detailed descriptions will be omitted.

Although relative terms such as "upper" and "lower" are used in this specification to describe the relative relationship of one component of an icon to another, these terms are used in this specification only for convenience, for example, according to the orientation of the examples described in the accompanying drawings. It can be understood that if the device of the icon is turned upside down, the components described as "upper" will become the "lower" components. Other relative terms such as "high", "low", "top", "bottom", "left", "right", and the like also have similar meanings. When a structure is "on" other structures, it may mean that the structure is integrally formed on other structures, or that the structure is "directly" disposed on other structures, or that the structure is "indirectly" disposed on other structures through another structure.

The terms "one", "a", "the" are used to indicate the presence of one or more elements/components/and the like; the terms "includes" and "has" are used to indicate an open-ended inclusion and to mean that additional elements/components/and the like may exist in addition to the listed elements/components/and the like.

The exemplary embodiment provides an ESD protection circuit. FIG. 1 is a schematic structural diagram of an exemplary embodiment of an ESD protection circuit according to the present disclosure. The ESD protection circuit may include a PNP-type triode Q1, an NPN-type triode Q2, a resistor R and a diode D1. The PNP-type triode Q1 includes an emitter connected to a second signal terminal V2, a base connected to a first node N1, and a collector connected to a second node N2. The NPN-type triode Q2 includes an emitter connected to a first signal terminal V1, a base connected to the second node N2, and a collector connected to the first node N1. The diode D1 includes an anode connected to the first node N1, and a cathode connected to the first signal terminal V1. The resistor R is connected between the second node N2 and the first signal terminal V1. As shown in FIG. 1, in case of an accumulation of static electricity on the second signal terminal V2, the diode D1 is turned on, and the current entering from the second signal terminal V2 sequentially flows through the first node N1 and the diode D1 and out from the first signal terminal V1. Therefore, the path from the second signal terminal V2, the first node N1, the diode D1 to the first signal terminal V1 can form an auxiliary trigger current path of the ESD protection circuit. With the auxiliary trigger current path, there is a potential difference between the emitter and the base of each of the NPN-type triode Q1 and the PNP-type triode Q2, resulting in that the NPN-type triode Q1 and the PNP-type triode Q2 are triggered and turned on. The turned-on NPN-type triode Q1 and the turned-on PNP-type triode Q2 form a positive feedback circuit, such that the ESD protection circuit can quickly discharge the static electricity on the second signal terminal V2 to the first signal terminal V1. The NPN-type triode Q1 and the PNP-type triode Q2 can be triggered and turned on by the ESD protection circuit with the assistance of the auxiliary trigger current path. Therefore, the ESD protection circuit has a low trigger voltage and a fast starting speed.

Figure 2:
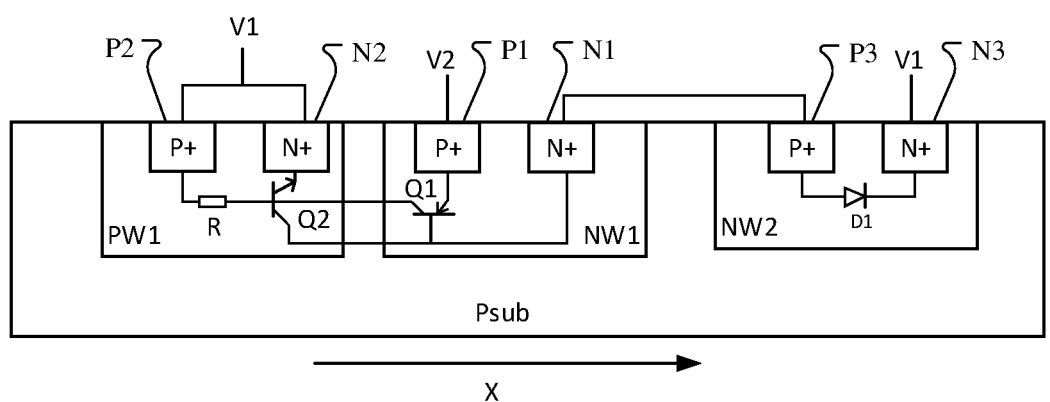
FIG. 2 is a schematic structural diagram of an exemplary embodiment of an ESD protection structure according to the present disclosure.

As shown in FIG. 2, the exemplary embodiment further provides an ESD protection structure. FIG. 2 is a schematic structural diagram of an exemplary embodiment of an ESD protection structure according to the present disclosure. The ESD protection structure can form the ESD protection circuit shown in FIG. 1. The ESD protection structure may include: a semiconductor substrate Psub, a first P-type well PW1, a first N-type well NW1, a first N-type doped portion N1, a first P-type doped portion P1, a second N-type doped portion N2, a second P-type doped portion P2, a third doped well NW2, a third P-type doped portion P3 and a third N-type doped portion N3. The first P-type well PW1 is located in the semiconductor substrate. The first N-type well NW1 is located in the semiconductor substrate. The first N-type doped portion N1 is located in the first N-type well NW1. The first P-type doped portion P1 is located in the first N-type well NW1, and spaced apart from the first N-type doped portion N1. The second N-type doped portion N2 is located in the first P-type well PW1. The second P-type doped portion P2 is located in the first P-type well PW1, and spaced apart from the second N-type doped portion N2. The third doped well NW2 is located in the semiconductor substrate. The third P-type doped portion P3 is located in the third doped well NW2. The third N-type doped portion N3 is located in the third doped well NW2, and spaced apart from the third P-type doped portion P3. The second N-type doped portion N2, the second P-type doped portion P2, and the third N-type doped portion N3 are electrically connected. The first N-type doped portion N1 is electrically connected to the third P-type doped portion P3.

In the exemplary embodiment, as shown in FIG. 2, the first P-type doped portion P1 may form the emitter of the PNP-type triode Q1. The first N-type well NW1 may form the base of the PNP-type triode Q1. The second P-type doped portion P2 may form the collector of the PNP-type triode Q1. The second N-type doped portion N2 may form the emitter of the NPN-type triode Q2. The first P-type well PW1 may form the base of the NPN-type triode Q2. The first N-type doped portion N1 may form the collector of the NPN-type triode Q2. The resistor belonging to the first P-type well PW1 may form the resistor R. The third P-type doped portion P3 may form the anode of the diode D1. The third N-type doped portion N3 may form the cathode of the diode D1.

The ESD protection structure provided by the exemplary embodiment has a same structure as the above ESD protection circuit, and has a low trigger voltage and a fast starting speed. In addition, the ESD protection structure has a small layout area to facilitate the design of the chip.

In the exemplary embodiment, as shown in FIG. 2, the second N-type doped portion N2, the second P-type doped portion P2, and the third N-type doped portion N3 may be electrically connected through a conductive wire. The first N-type doped portion N1 may be electrically connected to the third P-type doped portion P3 through a conductive wire. The conductive wire may be made of a metal material in the semiconductor process, and may also be made of a polycrystalline silicon material in the semiconductor process. In the exemplary embodiment, the semiconductor substrate Psub may be a P-type semiconductor substrate. It should be understood that, in other exemplary embodiments, the semiconductor substrate Psub may also be an N-type semiconductor substrate. In the exemplary embodiment, the third doped well NW2 may be an N-type doped well. It should be understood that, in other exemplary embodiments, the third doped well NW2 may also be a P-type doped well.

In the exemplary embodiment, as shown in FIG. 2, the first P-type well PW1 and the first N-type well NW1 may be spaced apart. The third doped well NW2 may be located on a side of the first N-type well NW1 away from the first P-type well PW1. The first P-type well PW1, the first N-type well NW1, and the third doped well NW2 may be sequentially arranged in a first direction X. The first direction X may be parallel to a plane of the semiconductor substrate. It should be understood that, in other exemplary embodiments, the first P-type well PW1 may be provided adjacent to the first N-type well NW1, namely the first P-type well PW1 may contact the first N-type well NW1. The first P-type well PW1, the first N-type well NW1 and the third doped well NW2 may also be arranged in other relative positional relationships. For example, the first P-type well PW1, the first N-type well NW1 and the third doped well NW2 may be sequentially arranged in the first direction.

In the exemplary embodiment, as shown in FIG. 2, the first P-type doped portion P1 may be located on a side of the first N-type doped portion N1 close to the first P-type well PW1. The second P-type doped portion P2 may be located on a side of the second N-type doped portion N2 away from the first N-type well NW1. The third N-type doped portion N3 may be located on a side of the third P-type doped portion P3 away from the first N-type well NW1. It should be understood that, in other exemplary embodiments, the first P-type doped portion P1, the second P-type doped portion P2, the third P-type doped portion P3, the first N-type doped portion N1, the second N-type doped portion N2 and the third N-type doped portion N3 may further be arranged in other relative positional relationships. For example, the second P-type doped portion P2 and the second N-type doped portion N2 may be interchangeable in position, and the first P-type doped portion P1 and the first N-type doped portion N1 may be interchangeable in position, etc.

Figure 3:
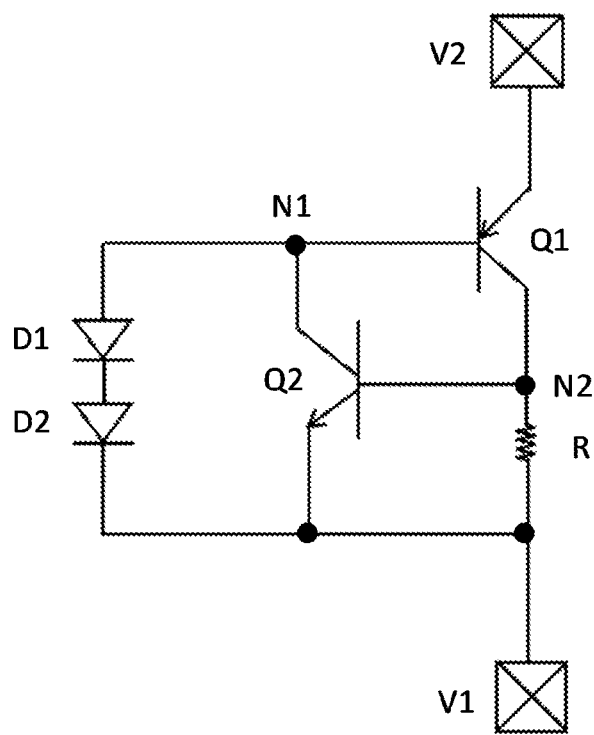
FIG. 3 is a schematic structural diagram of another exemplary embodiment of an ESD protection circuit according to the present disclosure.

FIG. 3 is a schematic structural diagram of another exemplary embodiment of an ESD protection circuit according to the present disclosure. Unlike FIG. 1, the ESD protection circuit shown in FIG. 3 includes two diodes D1 and D2. The two diodes may be connected in series between the first node N1 and the first signal terminal V1.

Figure 4:
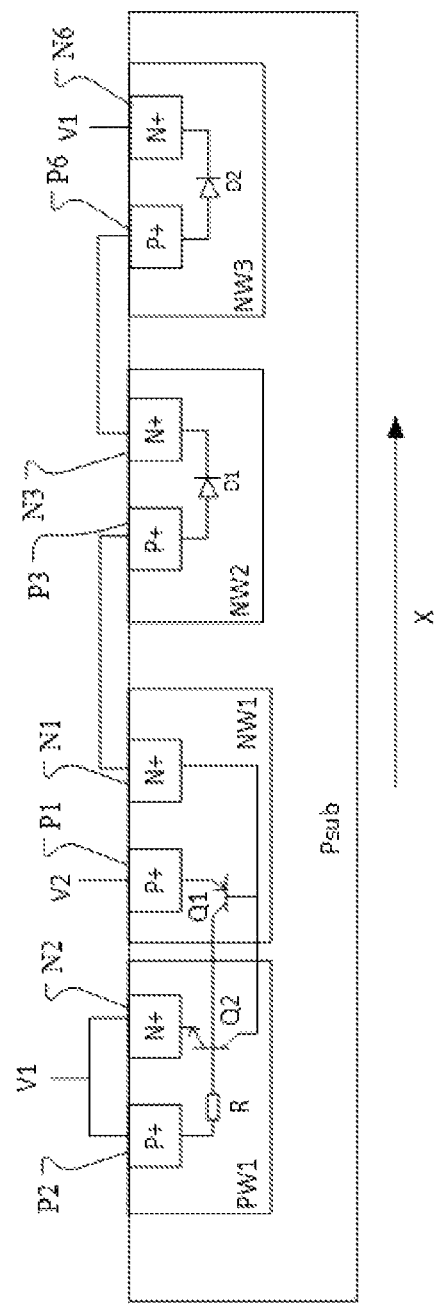
FIG. 4 is a schematic structural diagram of another exemplary embodiment of an ESD protection structure according to the present disclosure.

FIG. 4 is a schematic structural diagram of another exemplary embodiment of an ESD protection structure according to the present disclosure. The ESD protection structure can form the ESD protection circuit shown in FIG. 3. As shown in FIG. 4, unlike the ESD protection structure shown in FIG. 2, the ESD protection structure may further include another third doped well NW3, another third P-type doped portion P6 and another third N-type doped portion N6. The third P-type doped portion P6 and the third N-type doped portion N6 may be located in the third doped well NW3. The third P-type doped portion P6 and the third N-type doped portion N6 are spaced apart. The third doped well NW3 may be spaced apart from the third doped wells NW2 and thus is isolated through a P-type semiconductor substrate. The third N-type doped portion N6, the second N-type doped portion N2 and the second P-type doped portion P2 may be electrically connected to each other. The third P-type doped portion P6 may form an anode of the diode D2. The third N-type doped portion N6 may form a cathode of the diode D2. The third N-type doped portion N3 may be electrically connected to the third P-type doped portion P6 through a conductive wire. The ESD protection structure shown in FIG. 4 may have a higher trigger voltage than the ESD protection structure shown in FIG. 2.

Figure 5:
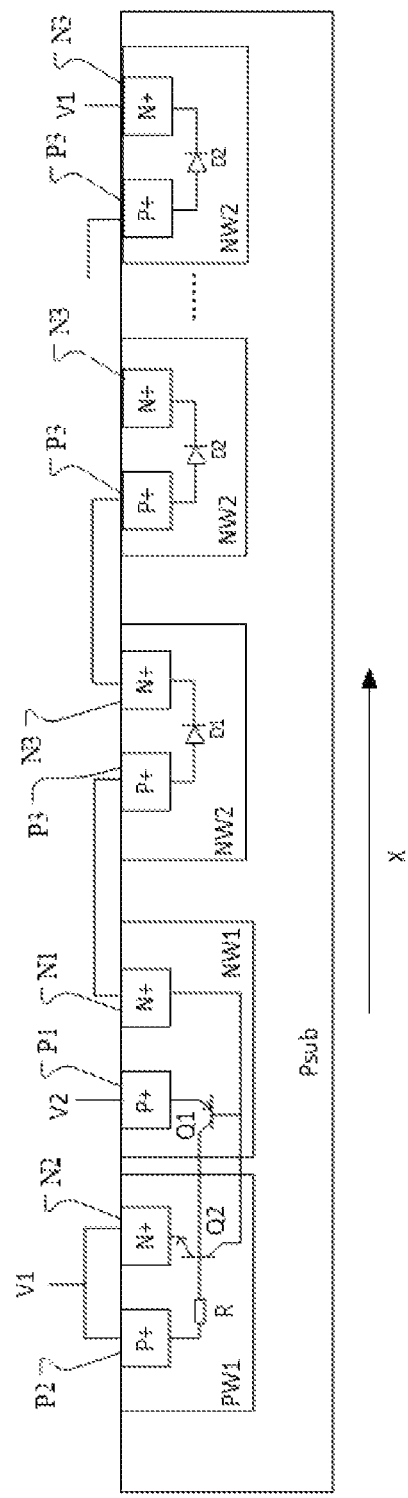
FIG. 5 is a schematic structural diagram of another exemplary embodiment of an ESD protection structure according to the present disclosure.

It should be understood that, in other exemplary embodiments, the trigger voltage of the ESD protection circuit may further be adjusted through a number of diodes connected in series between the first node and the first signal terminal V1. The greater the number of diodes connected in series, the higher the threshold voltage for turning on the diodes connected in series. Therefore, both the trigger voltage of the auxiliary trigger current path and the trigger voltage of the ESD protection circuit are higher. FIG. 5 is a schematic structural diagram of another exemplary embodiment of an ESD protection structure according to the present disclosure. In other exemplary embodiment, there may further be other numbers of diodes. Accordingly, the ESD protection structure may include multiple third doped wells NW2, multiple third P-type doped portions P3, and multiple third N-type doped portions N3. The multiple third doped wells NW2 may be spaced apart. The multiple third P-type doped portions P3 may be provided in one-to-one correspondence with the multiple third doped wells NW2. The multiple third N-type doped portions N3 may be provided in one-to-one correspondence with the multiple third doped wells NW2. The first N-type doped portion N1 may be electrically connected to any one of the multiple third P-type doped portions P3. The multiple third doped wells NW2 may be sequentially connected in series through the third P-type doped portions P3 and the third N-type doped portions N3 therein. In two adjacent third doped well, the third P-type doped portion P3 and the third N-type doped portion N3 in different third doped wells are electrically connected. The multiple third doped wells NW2 include a tail third doped well (the third doped well on the rightmost side). The tail third doped well may be connected to the first N-type doped portion N1 through the other of the multiple third doped wells NW2. The second N-type doped portion N2 and the second P-type doped portion P2 are electrically connected to a third N-type doped portion N3 in the tail third doped well.

In the exemplary embodiment, as shown in FIG. 4 and FIG. 5, in a same third doped well, a third N-type doped portion N3 may be located on a side of a third P-type doped portion P3 away from the first N-type well. In two adjacent third doped wells, adjacent third N-type doped portion N3 and third P-type doped portion P3 are electrically connected. Such an arrangement may facilitate an electrical connection between the third P-type doped portion P3 and the third N-type doped portion N3 in different third doped wells. It should be understood that, in other exemplary embodiments, in the same third doped well, the third P-type doped portion P3 may further be located on a side of the third N-type doped portion N3 away from the first N-type well. In the two adjacent third doped wells, the third N-type doped portion N3 may further be electrically connected to the non-adjacent third P-type doped portion P3.

In the exemplary embodiment, as shown in FIG. 4 and FIG. 5, all third doped wells may be located on a side of the first N-type well NW1 away from the first P-type well PW1. The first P-type well PW1, the first N-type well NW1, and the multiple third doped wells may be sequentially arranged in a first direction X.

Figure 6:
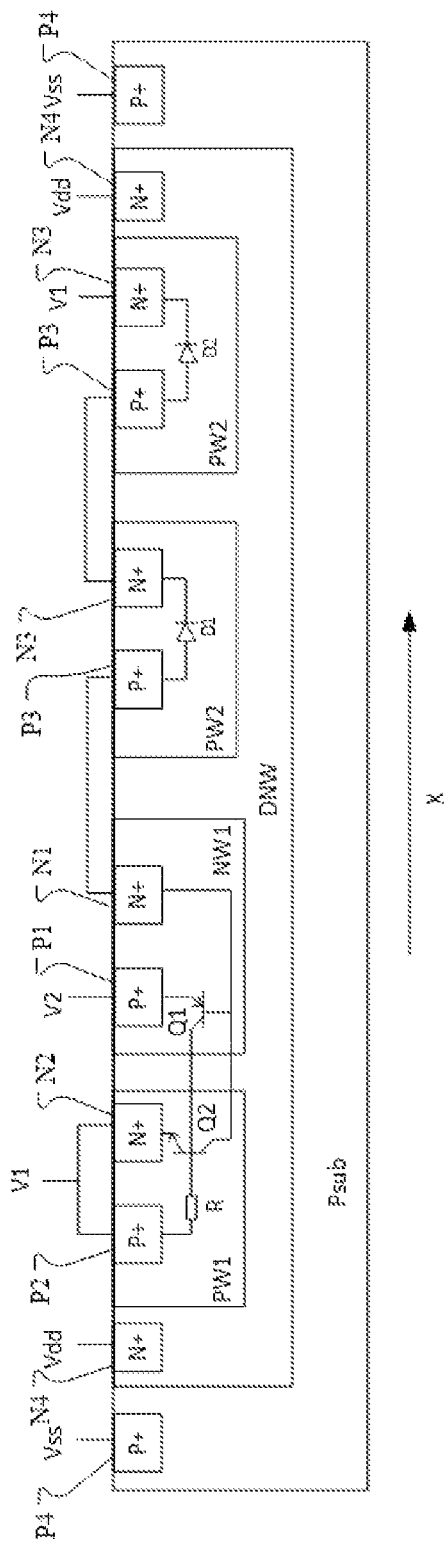
FIG. 6 is a schematic structural diagram of another exemplary embodiment of an ESD protection structure according to the present disclosure.
Figure 7:
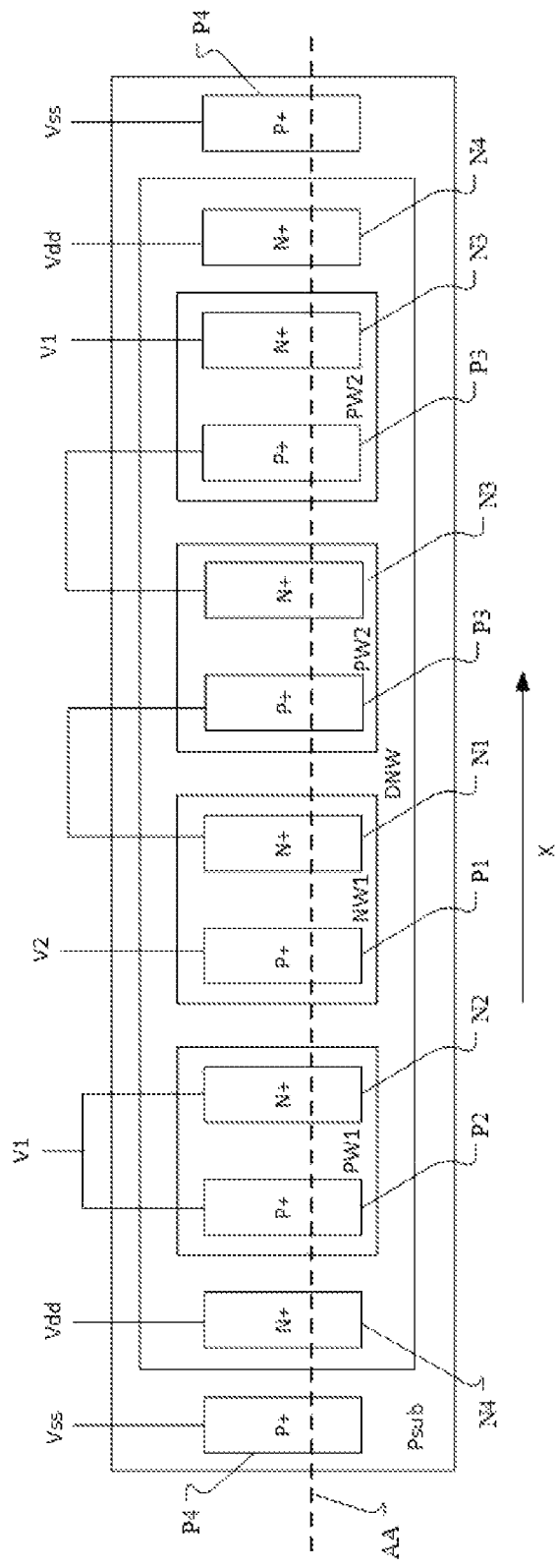
FIG. 7 is a top view of the ESD protection structure in FIG. 6.

In the exemplary embodiment, as shown in FIG. 6 and FIG. 7, FIG. 6 is a schematic structural diagram of another exemplary embodiment of an ESD protection structure according to the present disclosure, and FIG. 7 is a top view of the ESD protection structure in FIG. 6. FIG. 6 is a sectional view along the dotted line AA in FIG. 7. As shown in FIG. 6 and FIG. 7, the ESD protection structure may further include: an N-type deep well DNW. The N-type deep well is located in the semiconductor substrate. The first P-type well PW1, the first N-type well NW1, and the third doped wells are located in the N-type deep well. As shown in FIG. 6 and FIG. 7, in the exemplary embodiment, the third doped well PW2 may be a P-type doped well. The third doped wells PW2 may be isolated from each other through the N-type deep well DNW. In addition, the N-type deep well DNW may shield noise for components in the first N-type well NW1, the first P-type well PW1 and the third doped wells PW2, and can avoid electric leakage from the components to the P-type semiconductor substrate.

In the exemplary embodiment, as shown in FIG. 6 and FIG. 7, the ESD protection structure may further include: two fourth N-type doped portions N4. The two fourth N-type doped portions N4 may be located in the N-type deep well DNW. The two fourth N-type doped portions N4 may be electrically connected to a power supply terminal Vdd. With the two fourth N-type doped portions N4, potentials on different positions of the N-type deep well DNW are more uniform. In the exemplary embodiment, as shown in FIG. 6 and FIG. 7, one of the fourth N-type doped portions N4, the first P-type well PW1, the first N-type well NW1, the multiple third doped wells and the other of the fourth N-type doped portions N4 may be sequentially arranged in a first direction X. It should be understood that, in other exemplary embodiments, there may further be other numbers of fourth N-type doped portion N4. For example, there may be one fourth N-type doped portion N4, three fourth N-type doped portions and the like. The fourth N-type doped portion N4 may further be located at other positions in the N-type deep well DNW. For example, the fourth N-type doped portion N4 may further be located at any positions of the N-type deep well DNW other than the first P-type well PW1, the first N-type well NW1 and the third doped wells.

In the exemplary embodiment, as shown in FIG. 6 and FIG. 7, the ESD protection structure may further include: two fourth P-type doped portions P4. The two fourth P-type doped portions P4 may be located in the semiconductor substrate, and spaced apart from the N-type deep well DNW. The fourth P-type doped portions P4 may be electrically connected to a ground terminal Vss. With the two fourth P-type doped portions P4, potentials on different positions of the semiconductor substrate are more uniform. In the exemplary embodiment, the two fourth P-type doped portions P4 may be located on two sides of the N-type deep well DNW, respectively. One of the fourth P-type doped portions P4, the N-type deep well DNW and the other of the fourth P-type doped portions P4 may be sequentially arranged in a first direction X. It should be understood that, in other exemplary embodiments, there may further be other numbers of fourth P-type doped portion P4. For example, there may be one fourth P-type doped portion P4, three fourth P-type doped portions and the like. The fourth P-type doped portion P4 may further be located at other positions. For example, the fourth P-type doped portion P4 may further be located at any positions other than the N-type deep well DNW.

It should be noted that the ground terminal Vss may be construed as a ground terminal of the chip in which the ESD protection structure is located, and the power supply terminal Vdd may be construed as a power supply terminal of the chip in which the ESD protection structure is located. The semiconductor substrate Psub and the N-type deep well DNW in the ESD protection circuit may form a diode. The diode includes an anode connected to the ground terminal of the chip in which the ESD protection structure is located, and a cathode connected to the power supply terminal of the chip in which the ESD protection structure is located. Therefore, the diode can form a path for discharging the static electricity from the ground terminal of the chip to the power supply terminal of the chip.

In the exemplary embodiment, the doping concentration of the doped well (for example, the first P-type well, the first N-type well or the third doped well) may be less than that of the doped portion (for example, the first N-type doped portion, the first P-type doped portion, the second N-type doped portion, the second P-type doped portion, the third N-type doped portion, the third P-type doped portion, the fourth N-type doped portion or the fourth P-type doped portion).

Figure 8:
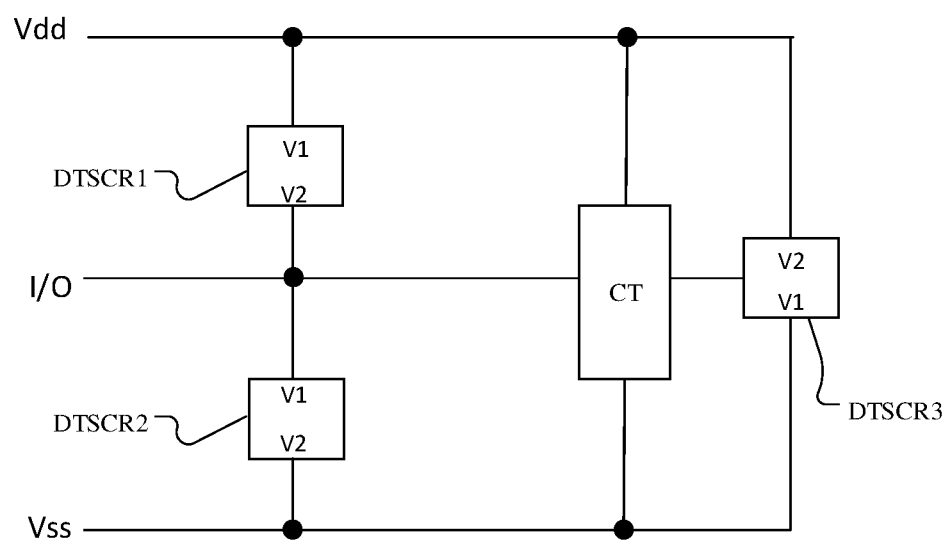
FIG. 8 is a schematic structural diagram of an exemplary embodiment of a chip according to the present disclosure.

The exemplary embodiment further provides a chip, and the chip includes the ESD protection structure described above. FIG. 8 is a schematic structural diagram of an exemplary embodiment of a chip according to the present disclosure. In the exemplary embodiment, the second N-type doped portion in the ESD protection structure may form a first signal terminal V1 of the ESD protection structure, and the first P-type doped portion in the ESD protection structure may form a second signal terminal V2 of the ESD protection structure. The chip includes a core processing circuit CT, as well as the power supply terminal Vdd, the ground terminal Vss and a signal transmission terminal I/O that are connected to the core processing circuit CT. The chip may include multiple ESD protection structures. The multiple ESD protection structures may include: a first ESD protection structure DTSCR1, a second ESD protection structure DTSCR2 and a third ESD protection structure DTSCR3. The first ESD protection structure DTSCR1 includes a first signal terminal V1 connected to the power supply terminal Vdd, and a second signal terminal V2 connected to the signal transmission terminal I/O. The second ESD protection structure DTSCR2 includes a first signal terminal V1 connected to the signal transmission terminal I/O, and a second signal terminal V2 connected to the ground terminal Vss. The third ESD protection structure DTSCR3 includes a first signal terminal V1 connected to the ground terminal Vss, and a second signal terminal V2 connected to the power supply terminal Vdd. The static electricity on the signal transmission terminal I/O may be discharged to the power supply terminal Vdd through the first ESD protection structure DTSCR1. The static electricity on the ground terminal Vss may be discharged to the signal transmission terminal I/O through the second ESD protection structure DTSCR2. The static electricity on the power supply terminal Vdd may be discharged to the ground terminal Vss through the third ESD protection structure DTSCR3. In addition, the static electricity on the ground terminal Vss may be discharged to the power supply terminal Vdd through the diode formed by the semiconductor substrate and the N-type doped deep well. It should be understood that the chip may be any chip such as a memory chip, the chip may further include other signal transmission terminals, and the other signal terminals may also discharge the static electricity through the ESD protection structure.

Those skilled in the art can readily figure out other embodiments of the present disclosure after considering the specification and practicing the content disclosed herein. The present disclosure is intended to cover any variations, purposes or adaptive changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the claims.

It should be noted that, the present disclosure is not limited to the precise structures described above and shown in the drawings, and can be modified and changed in many ways without departing from the scope of the present disclosure. The scope of the present disclosure is defined by the appended claims.

The invention claimed is:

1. An electro-static discharge protection structure, comprising:
 a semiconductor substrate;
 a first P-type well, located in the semiconductor substrate;
 a first N-type well, located in the semiconductor substrate;
 a first N-type doped portion, located in the first N-type well;
 a first P-type doped portion, located in the first N-type well, and spaced apart from the first N-type doped portion;
 a second N-type doped portion, located in the first P-type well;
 a second P-type doped portion, located in the first P-type well, and spaced apart from the second N-type doped portion;
 a third doped well, located in the semiconductor substrate;
 a third P-type doped portion, located in the third doped well; and
 a third N-type doped portions, located in the third doped well, and spaced apart from the third P-type doped portion,
 wherein the second N-type doped portion, the second P-type doped portion and the third N-type doped portion are electrically connected; and the first N-type doped portion is electrically connected to the third P-type doped portion.

2. The electro-static discharge protection structure according to claim 1, comprising a plurality of the third doped wells, a plurality of the third P-type doped portions and a plurality of the third N-type doped portions, wherein
the plurality of the third doped wells are spaced apart, the plurality of the third P-type doped portions are provided in one-to-one correspondence with the plurality of the third doped wells, and the plurality of the third N-type doped portions are provided in one-to-one correspondence with the plurality of the third doped wells;
the first N-type doped portion is electrically connected to any one of the plurality of the third P-type doped portions;
the plurality of the third doped wells are sequentially connected in series through the third P-type doped portions and the third N-type doped portions therein, and in two adjacent connected third doped wells, the third P-type doped portion and the third N-type doped portion in different third doped wells are electrically connected; and
the plurality of the third doped wells comprise a tail third doped well, the tail third doped well is connected to the first N-type doped portion through the other of the plurality of the third doped wells, and the second N-type doped portion and the second P-type doped portion are electrically connected to the third N-type doped portion in the tail third doped well.

3. The electro-static discharge protection structure according to claim 2, wherein there are two third doped wells.

4. The electro-static discharge protection structure according to claim 2, wherein the third doped well is located on a side of the first N-type well away from the first P-type well, the first P-type well, the first N-type well and the plurality of the third doped wells are sequentially arranged in a first direction, and the first direction is parallel to a plane of the semiconductor substrate.

5. The electro-static discharge protection structure according to claim 4, wherein
the first P-type doped portion is located on a side of the first N-type doped portion close to the first P-type well, and the second P-type doped portion is located on a side of the second N-type doped portion away from the first N-type well; and
in a same third doped well, the third N-type doped portion is located on a side of the third P-type doped portion away from the first N-type well, and in two adjacent third doped wells, adjacent third N-type doped portion and third P-type doped portion are electrically connected.

6. The electro-static discharge protection structure according to claim 2, wherein the third doped well is a P-type doped well or an N-type doped well.

7. The electro-static discharge protection structure according to claim 2, wherein the semiconductor substrate is a P-type semiconductor substrate.

8. The electro-static discharge protection structure according to claim 7, wherein the third doped well is a P-type well, and the electro-static discharge protection structure further comprises:
an N-type deep well, located in the semiconductor substrate, the first P-type well, the first N-type well and the third doped well being located in the N-type deep well.

9. The electro-static discharge protection structure according to claim 8, further comprising:
a fourth N-type doped portion, located in the N-type deep well, and connected to a power supply terminal.

10. The electro-static discharge protection structure according to claim 9, comprising two fourth N-type doped portions, wherein
one of the fourth N-type doped portions, the first P-type well, the first N-type well, the plurality of the third doped wells and the other of the fourth N-type doped portions are sequentially arranged in a first direction, and the first direction is parallel to a plane of the semiconductor substrate.

11. The electro-static discharge protection structure according to claim 8, further comprising:
a fourth P-type doped portion, located in the semiconductor substrate, spaced apart from the N-type deep well, and connected to a ground terminal.

12. The electro-static discharge protection structure according to claim 11, comprising two fourth P-type doped portions, wherein
the two fourth P-type doped portions are located on two sides of the N-type deep well respectively; and one of the fourth P-type doped portions, the N-type deep well and the other of the fourth P-type doped portions are sequentially arranged in a first direction, and
the first direction is parallel to a plane of the semiconductor substrate.

13. The electro-static discharge protection structure according to claim 1, wherein
the second N-type doped portion, the second P-type doped portion and the third N-type doped portion are electrically connected through a conductive wire; and
the first N-type doped portion is electrically connected to the third P-type doped portion through a conductive wire.

14. A chip, comprising the electro-static discharge protection structure according to claim 1.

15. The chip according to claim 14, wherein the second N-type doped portion in the electro-static discharge protection structure forms a first signal terminal of the electro-static discharge protection structure, and the first P-type doped portion in the electro-static discharge protection structure forms a second signal terminal of the electro-static discharge protection structure; and
the chip comprises a power supply terminal, a ground terminal and a signal transmission terminal, the chip comprises a plurality of the electro-static discharge protection structures, and the plurality of the electro-static discharge protection structures comprise:
a first electro-static discharge protection structure, comprising a first signal terminal connected to the power supply terminal, and a second signal terminal connected to the signal transmission terminal;
a second electro-static discharge protection structure, comprising a first signal terminal connected to the signal transmission terminal, and a second signal terminal connected to the ground terminal; and
a third electro-static discharge protection structure, comprising a first signal terminal connected to the ground terminal, and a second signal terminal connected to the power supply terminal.

* * * * *